US006647163B2

(12) United States Patent
Song

(10) Patent No.: US 6,647,163 B2
(45) Date of Patent: Nov. 11, 2003

(54) OPTICAL MEMORY APPARATUS AND METHOD

(75) Inventor: Shaowen Song, 704 Brandenburg Boulevard, Waterloo On (CA), N2T 2V4

(73) Assignee: Shaowen Song, Waterloo (CA)

( * ) Notice: Subject to any disclaimer, the term of this patent is extended or adjusted under 35 U.S.C. 154(b) by 220 days.

(21) Appl. No.: 09/860,430

(22) Filed: May 21, 2001

(65) Prior Publication Data

US 2001/0055439 A1 Dec. 27, 2001

Related U.S. Application Data

(60) Provisional application No. 60/291,983, filed on May 21, 2001, and provisional application No. 60/205,561, filed on May 22, 2000.

(51) Int. Cl.[7] .............................................. G02B 6/42
(52) U.S. Cl. ......................... 385/15; 359/108; 385/27
(58) Field of Search ............................ 385/14, 15, 37; 359/108

(56) References Cited

U.S. PATENT DOCUMENTS

| 3,573,433 | A | | 4/1971 | Harris |
| 4,504,846 | A | | 3/1985 | Chappell et al. |
| 4,823,360 | A | * | 4/1989 | Tremblay et al. ............ 375/214 |
| 5,315,422 | A | * | 5/1994 | Utaka et al. ..................... 385/3 |
| 5,999,283 | A | * | 12/1999 | Roberts et al. ................. 385/3 |
| 5,999,284 | A | | 12/1999 | Roberts |
| 6,335,813 | B1 | * | 1/2002 | Janz et al. ................... 398/197 |
| 6,366,382 | B1 | * | 4/2002 | Morthier et al. ............. 398/178 |
| 6,462,860 | B1 | * | 10/2002 | Ionov .......................... 359/325 |
| 6,490,044 | B1 | * | 12/2002 | Koch et al. .................. 356/478 |

FOREIGN PATENT DOCUMENTS

| JP | 08171108 | 7/1996 |
| WO | WO 98/20376 | 5/1998 |
| WO | WO 00/04669 | 1/2000 |

OTHER PUBLICATIONS

Poustie et al., "All–optical regenerative memory with full write/read capability", Optics Communications 154, pp. 277–281, Elsevier Science B.V., Sep. 15, 1998.

* cited by examiner

Primary Examiner—Michael P. Stafira

(57) ABSTRACT

An optical memory suitable for storing optical signals from a set of predetermined wavelengths is demonstrated. This memory is random access, allowing a controller to read the stored data at any point in time. The memory has a memory input port for receiving a first optical signal, an optical storage element for storing an optical signal and its predetermined wavelength. The optical storage element features a set of optical sources each having a predetermined wavelength and is for providing an intensity and a wavelength of light stored therein. The optical memory also has a memory output port which is optically coupled to the optical storage element for selectively providing an output signal based on the wavelength and intensity of the light within the optical storage element.

10 Claims, 8 Drawing Sheets

OPTICAL MEMORY APPARATUS AND METHOD

This application is a non-provisional application of U.S. Provisional Application Ser. No. 60/205,561, filed May 22, 2000, and No. 60/291,983, filed May 21, 2001.

FIELD OF THE INVENTION

This invention relates to optical memory and more specifically Optical Random Access Memory (O-RAM) and Optical Read Only Memory (O-ROM) for applications involving optical computing and optical fibre communications.

BACKGROUND OF THE INVENTION

The need for data networks with the ability to move very large quantities of information over very long distances has resulted in optical networks replacing electrical networks for telecommunications and data services. The optical communication systems used to link the individual elements of a high-speed data network take advantage of wavelength division multiplexing or WDM. The propagation of multiple wavelengths of light within a single strand of optical fibre boosts the total bandwidth of the fibre but requires specialized equipment to carry out various functions such as separating the various wavelengths. Information travelling between the nodes of a SONET (synchronous optical network) or the Internet moves as pulses of light but are converted to electrical signals, and then converted back into light for being redirected. The conversion of light into electrical signals is carried out because, at present, redirecting optical signals purely within the optical domain is very difficult. In the Internet case, the difficulty stems from two main causes. First, to transmit the optical signal to the right destination location, the router must know what the correct destination is. To determine the right destination the router must read the information. To do this the router must convert the optical data to an electrical data packet for packet analysis. Second, once the router has determined a correct destination, the packet has already propagated beyond the router. While it has been proposed to send the header of the packet before the packet, specifically to address this problem, this option is not helpful in that if, for any reason, the router is not ready for the packet when it arrives, the communication link will not be successfully maintained. Currently, the packets are buffered by electric memories after the optical signals are converted to electrical ones. This limits the bit rate of the optical transmissions. Therefore an optical memory, designed for telecommunications purposes, to store optical signals such as an optical buffer is advantageous. When combining WDM or DWDM (Dense WDM) with the Internet, the wavelength channels within one fibre are used for transmitting the packets. In order for an optical memory to be suitable for this application it must be capable of receiving, storing and producing combinations of signals at individual wavelengths used by the network. In the all-optical wavelength routing WDM or DWDM network, it becomes essential to buffer the signal in the optical domain. This is because that the all-optical wavelength router requires a switching time to set up the route for the signal. Therefore, an optical memory and more specifically a random access optical memory is essential to the all-optical wavelength routing WDM network.

While advances in optical communications caused electrical long distance networks to become obsolete, the same is not true of computers. There are significant technological issues preventing the deployment of optical computers, one of which is that no random access optical memories are presently available. One of the advantages of optical signals over electrical signals is that they do not produce electric or magnetic fields. Also, unlike electrical signals, they are very insensitive to external electric and magnetic fields. This insensitivity is an advantage if the optical signal is being transmitted a long distance but it makes storing and guiding optical signals more difficult. As optical computers hold tremendous promise, many researchers have tried to develop optical memories.

As used herein, the terms "storing" and "retrieving" optical signals occur very quickly and the storage of the signal itself occurs in the optical domain. This alleviates many of the problems with electro-optical solutions available today. Currently, storing and retrieving an optical signal involves an optical to electrical to optical (or OEO) conversion. As shown in FIG. 1, this conversion typically includes the following steps: A multi-wavelength optical signal enters a "receiving module". The optical signal is wavelength demultiplexed creating a set of optical signals, each of which has only one wavelength. Each optical signal in the set goes to a separate detector. The detectors convert each optical signal into a corresponding electrical signal. The electrical signal is digitised to quantise the data and the quantised data is then stored in a conventional electrical memory.

At some point the electrical system is instructed to send the optical signal by the following steps: The electrical signals are retrieved and provided to lasers for modulation thereof. The individual laser having the correct wavelength of the constituent optical signal is modulated to recreate a signal similar to the original optical signal. The different optical signals are then wavelength division multiplexed causing each of the signals to propagate within a single medium, typically an optical fibre.

This conversion is commonly used; however, there is a strong desire to eliminate it. The detectors and the lasers are very expensive and rare. The cost and availability of these components vary dramatically based on quality and performance. This conversion is needed to store the signal temporarily. Much of the cost is associated with converting the optical signal into an electrical signal and back again into the optical domain.

An optical memory more suitable for telecommunication purposes would be able to store the optical signal and later transmit the same signal without the need to convert it into an electrical signal and then back into an optical signal. Similarly, the signal used to trigger the writing or reading of the optical signal is preferably also optical. Finally, the signal is preferably stored in the optical domain, in other words, the stream of photons remains a stream of photons. There are optical memories that operate by storing optical information in the physical domain, such as a photograph. Unfortunately, these are not considered practicable solutions for telecommunications or other data transmission problems.

In a truly random access memory architecture any cell of the memory can be made to provide information at an output port thereof. A common approach to producing an optical memory is to create a waveguide that features a loop structure in which any optical signal on the loop propagates in a continuous circuit about the loop. This allows a stream of data to be stored and retrieved. Since the optical signal travels a long distance other problems arise, such as attenuation and dispersion. Technology has kept up with these problems to a large extent by inserting amplifiers within the loops to maintain the signal strength.

These problems are analogous to dispersion and degradation problems in long distance, high speed data networks. Ensuring that optical data do not suffer from signal degradation, specifically attenuation and signal dispersion, requires highly specialized optical components that are costly and can be difficult to obtain. As related technology advances and production techniques improve, the components needed to reduce signal degradation will likely become cheaper and more readily available. However, even with the best components, some signal degradation will be experienced if the optical signal is to be stored for an extended period of time using a loop design. The longer the signal is stored, the harder it will be to properly compensate for the reduction in signal quality.

In U.S. Pat. No. 5,740,117, a method of storing optical signals in a loop structure is described. The method allows for storing a fixed amount of information within an optical loop. In order to do this effectively, the system must keep track of the time when the data entered the memory, or it must be capable of recognizing a point or header within the optical signal. Since an optical signal—a stream of information—is being stored, it is important that the signal not suffer degradation. Similarly, it is important that a control unit controlling the memory track an interval since the memory was loaded with the required information. In the event that the system accesses the memory at the wrong time, incorrect data from the stream is retrieved.

Ideally, a memory control unit would not have to know when the memory was last loaded. Also it is unclear how this style of optical memory could be used for multiple wavelengths simultaneously. It is known that different wavelengths of light propagate through waveguides at different speeds. The effect is known as wavelength dispersion. This would clearly be problematic in a system where the contents of the memory must be written at a very precise time. Further, the patent does not address multiwavelength optical storage.

The loop structure in the above example provides a buffer for storing the signal for a brief period of time. While this is useful in some applications it lacks flexibility. The option of storing optical information for an extended period of time is very desirable. Similarly, the ability to read the same information more than once, which is analogous to electronic random access memory, is beneficial. The loop architecture is shown in FIG. 2. A data signal enters the loop 20 and is routed by a coupler. The data stream stays in the loop 22 until the coupler allows it out.

In U.S. Pat. No. 5,999,283 in the name of Roberts and Whiteaway is disclosed an optical logic device with a Mach-Zender interferometer (MZI) featuring a pair of semiconductor optical amplifiers (SOA). This structure can be used to produce a variety of Boolean logic gates operating in the optical domain. Roberts builds upon this work in U.S. Pat. No. 5,999,284 by demonstrating that this structure can also be used to produce a latching optical memory. This patent shows how this architecture can be used to produce a variety of simple optical circuits. The electrical equivalents of these circuits are the basic building blocks of the Boolean electrical computer.

Unfortunately, the use of Boolean logic gates requires a single input signal to a single gate. As such, there is no extension of the logic to existing WDM optical networks.

The use of holograms to store data optically holds tremendous promise. The main advantage to this technique is that a small hologram is theoretically capable of holding very large quantities of data. However, a hologram is fundamentally different from an ideal optical memory for high-speed data networks because it stores the information in the physical domain, instead of storing the data in the optical domain. In operation, the hologram writes information into a medium and then illuminates the medium to retrieve the information. It would be advantageous to store the optical signal containing the light in more of an active system.

It would be very advantageous to design an optical memory supporting a known range of wavelengths, thereby making it suitable for WDM networks and related applications. Further, it is desirable to have the contents of the memory available immediately. In order to produce an optical computer it is preferable to have an optical memory whose control functions are all controlled by other optical signals and whose operation is very fast.

BRIEF DESCRIPTION OF THE DRAWINGS

An embodiment of the invention will now be described with reference to the drawings in which.

DETAILED DESCRIPTION OF THE INVENTION

The invention allows the storage and retrieval of optical signals at each of several different wavelengths. These wavelengths are typically limited to a known group so that the correct memory unit is chosen, ensuring that all required wavelengths are properly supported.

It is convenient to define an O-AND gate. This gate simplifies the transmission of optical data allowing control of the flow of data within the optical memory.

Figure 1:
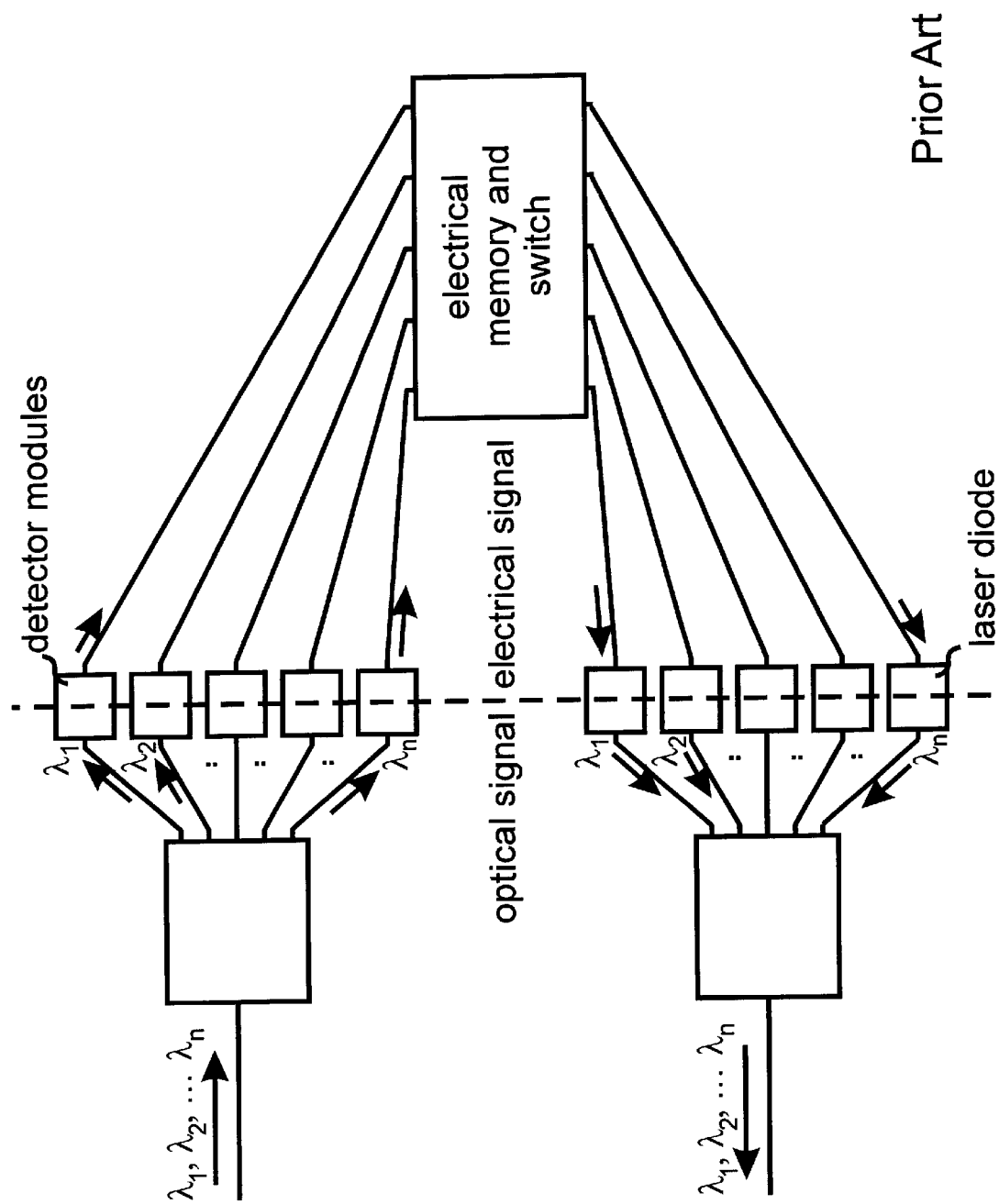
FIG. 1 is a block diagram showing the steps required to convert an optical signal to an electrical signal and then back to an optical signal according to the prior art.
Figure 2:
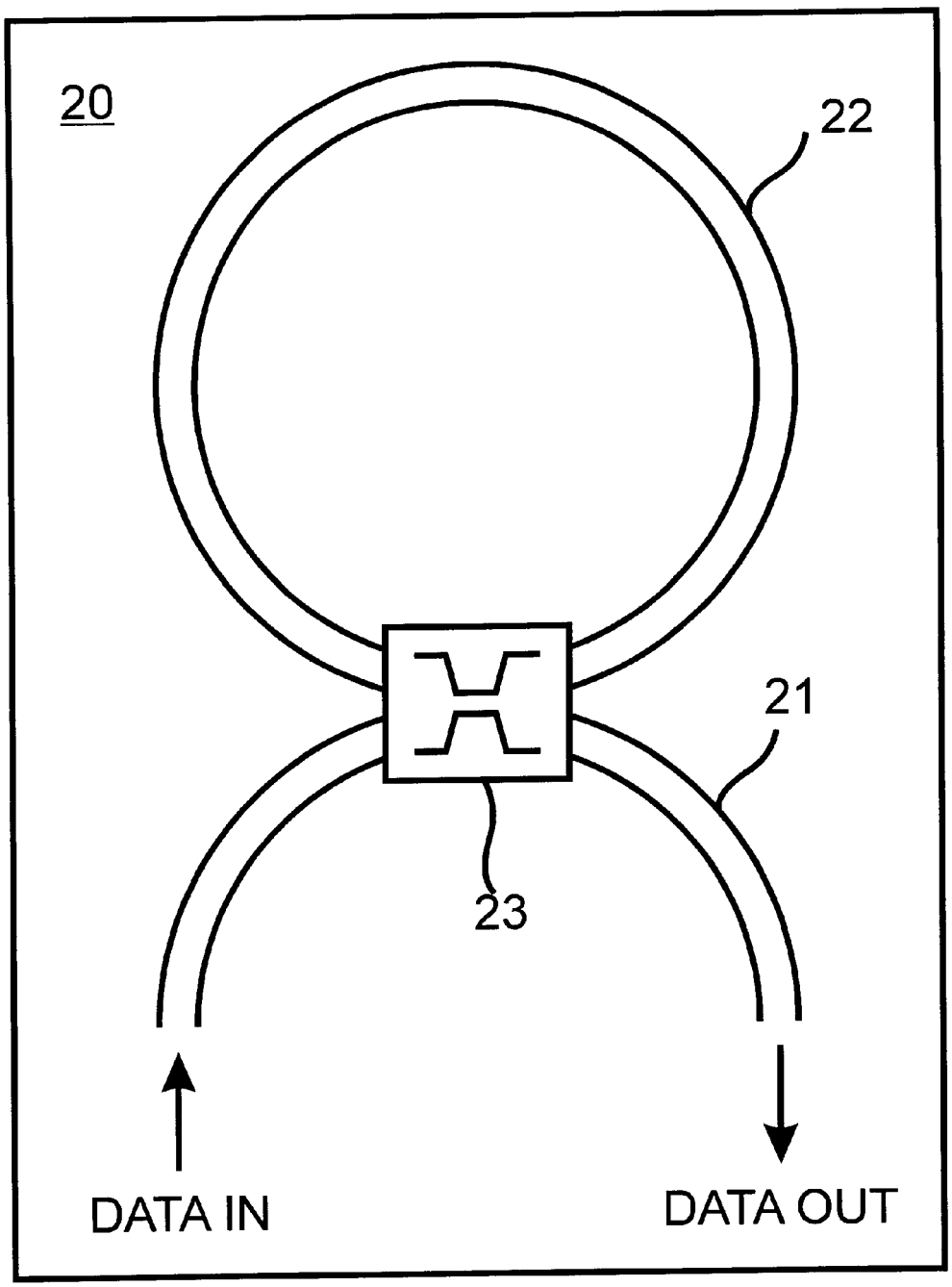
FIG. 2 is a schematic diagram of a prior art optical memory featuring a loop architecture.
Figure 3:
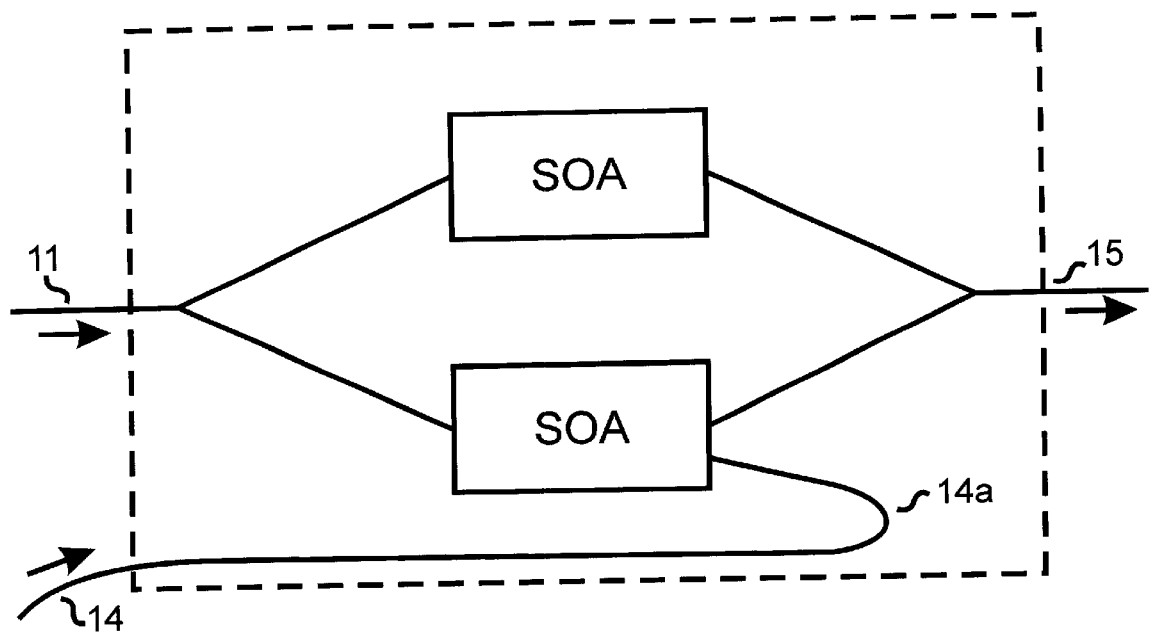
FIG. 3 is block diagram of a Mach-Zehnder interferometer used as an O-AND optical logic gate.

Referring to FIG. 3, an O-AND optical logic gate is shown for producing the transfer function given in Table 1.1. There are numerous ways of achieving this transfer function in an all optical device. FIG. 1 shows a simple embodiment using an MZI with two SOAs. The gate 10 has two input ports 11 and 14a and one output port 15. A first optical logic signal X enters the MZI at the first input port 11. It will exit the MZI 10 through the output port 15 provided that a second input signal Y having a predetermined value is present at the second input port 14a entering the SOA. Within a broad range, the wavelength of the signal entering the SOA through input port 14 does not affect the operation of the device. When an optical signal exits the gate at the output port 15 it will have the same wavelength as the signal at the first input port 11, although it has been modulated by light entering at the second input port 14.

TABLE 1.1

O-AND Optical Logic Gate Output

| X Input Port 11 | Y Input Port 14 | X O-AND Y Output Port 15 | Y O-AND X |
|---|---|---|---|
| 0 | 0 | 0 | 0 |
| 0 | Y | 0 | 0 |
| X | 0 | 0 | 0 |
| X | Y | X | Y |

Figure 4:
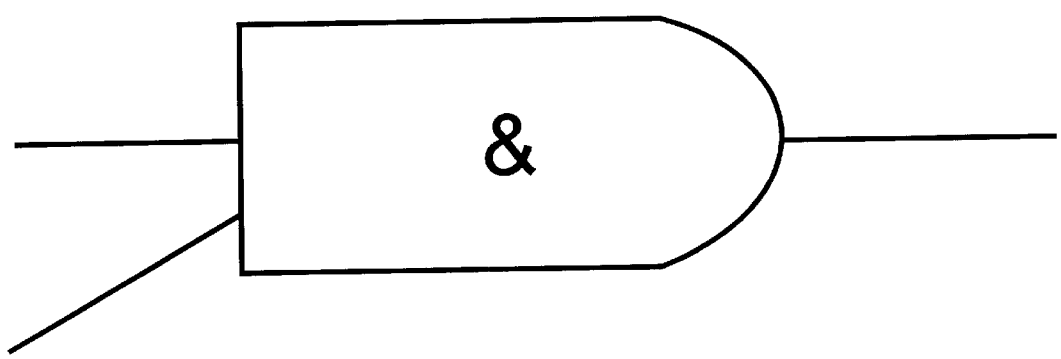
FIG. 4 is a block diagram used to represent a single O-AND optical logic gate.

FIG. 4 shows a block diagram of the O-AND optical logic gate that will be used in other figures for simplicity. The present inventive optical memory device uses the presence of an optical input signal to control the output signals of a series of continuously operating optical sources. In this way, an output signal is always present.

It is also convenient to describe an optical signal inverter. The inverter is created with a semiconductor optical amplifier or SOA. The SOA accepts a continuous pump input and a data signal input. When the data signal input supplies no light, the pump signal passes through the SOA with minimal attenuation. When the data signal input has a signal the energy in the SOA is depleted and the pump signal is attenuated. The wavelength of the output signal is always equal the wavelength of the pump signal. The wavelength of the data signal input is not relevant to the operation of the inverter within a broad range of wavelengths normally used in fibre optic communications.

Figure 5:
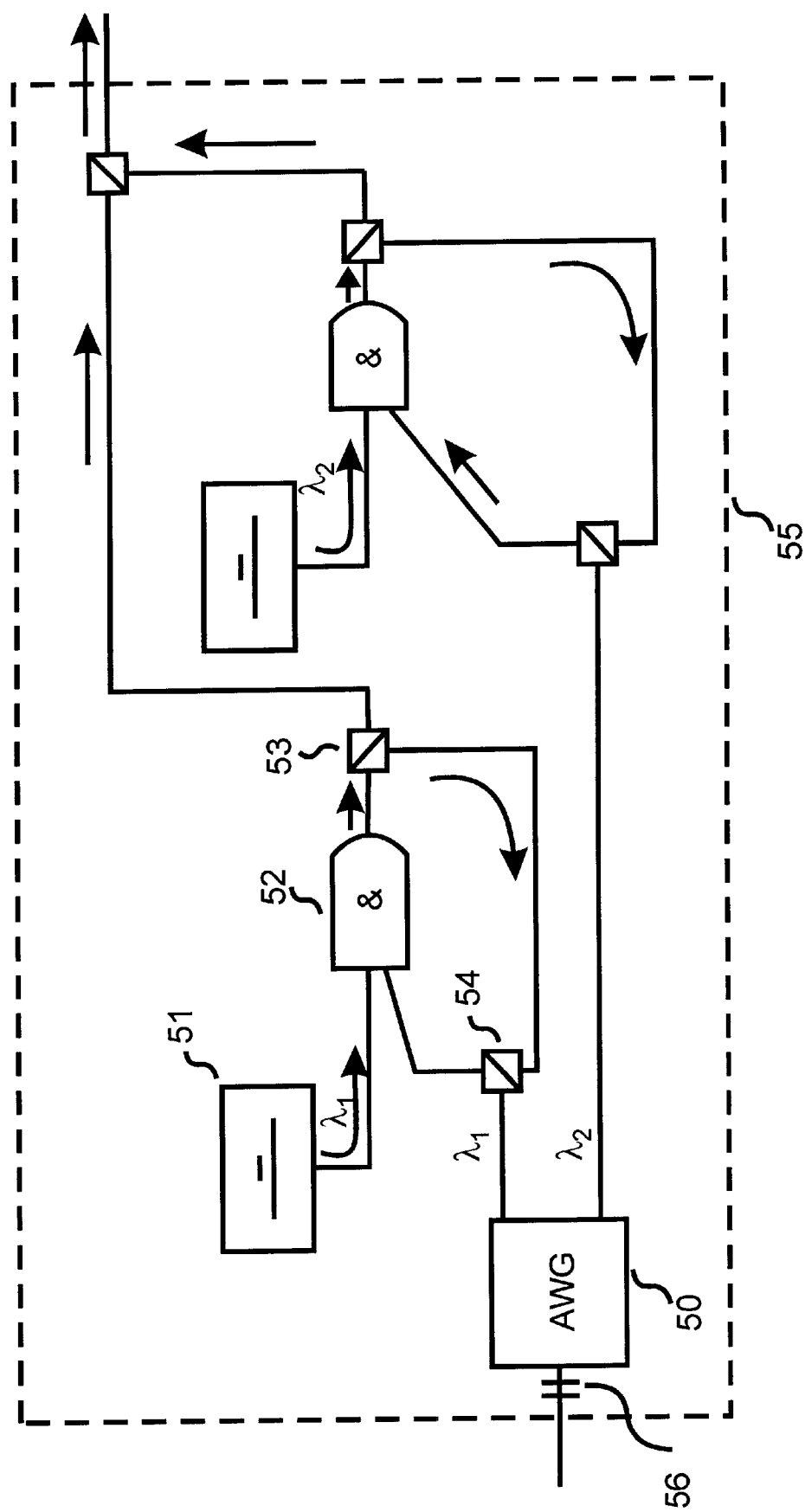
FIG. 5 is a block diagram of an embodiment of the optical memory configured as read only memory.

In a first embodiment of the optical memory unit 55 as shown in FIG. 5, an input optical signal is received by the optical memory unit and is separated into its constituent wavelengths with an arrayed waveguide grating demultiplexer 50. The presence of an optical signal at a predetermined wavelength is used to couple a separate source 51 at the same wavelength to an output port. This is accomplished using a Mach Zehnder Interferometer configured as an O-AND gate 52. To ensure that the correct source remains coupled to the output, the output signal of the Mach Zehnder Interferometer is tapped, using a coupler 53, and combined with the input optical signal using a second tap 54. A junction 56 near the input port allows permanent optical decoupling of the input port from the remainder of the optical memory cell. This cell will continuously produce an output signal whose wavelength corresponds to the wavelength of any input signal provided that the input signal is at a wavelength within the predetermined set of wavelengths. In operation, this structure does not amplify an existing signal but instead produces a new signal at the correct wavelength where the input signal is used to couple the individual sources to the output. There is a continuous source for every input wavelength band over a known range corresponding the wavelength range of the input signals. The output ports of the individual cells are combined using a coupler to produce a single output signal. This embodiment corresponds to electrical programmable read only memory or PROM. This embodiment will be referred to as "O-PROM". The diagram of this embodiment, shown in FIG. 5, supports two wavelength channels. Clearly, this design can be modified to support any number of predetermined wavelength channels.

The memory will maintain a corresponding wavelength to any optical signal presented at the input port whose wavelength is supported. This is advantageous to the distribution of continuous media signals, such as radio signals or television signals.

This memory cell only stores one single multiple wavelength data entry at a time. It will not read a stream of optical data. Consequently, a series of these optical memory units are required if a stream of data is to be recorded. Thus, a long stream of data requires a correspondingly large number of optical memory units. Unlike the prior art, data from this memory structure is not temporally confined to when the data is at an appropriate location within a loop. The data is always available and it suffers no substantial degradation regardless of how long it has been stored.

Figure 6:
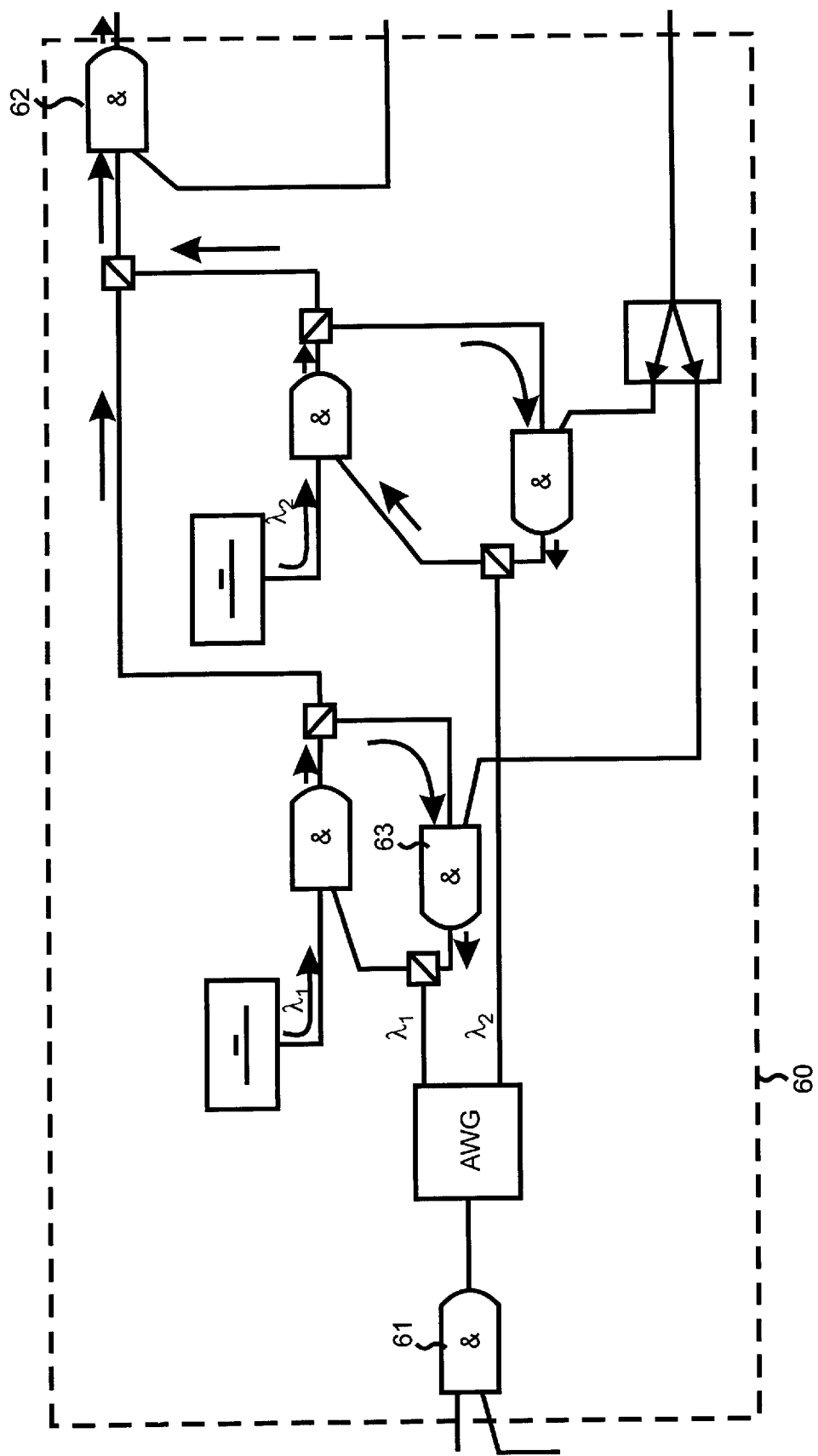
FIG. 6 is a block diagram of optical memory configured as random access memory.

FIG. 6 shows a second embodiment. In the second embodiment, the optical memory unit 60 has an O-AND gate 61 optically coupled with the input port such that there can only be an optical signal present at the input when a first optical control signal is also present. This first optical control signal indicates a "write" operation is to be performed. Further, this embodiment features a second O-AND gate 62 at the output port of the optical memory unit, preventing data from being sent until a second optical control signal is present. This second optical control signal indicates a "read" operation—often termed the "read" control signal. Finally, a pair of O-AND gates reside within each wavelength unit in the memory cell. This pair of O-AND gates forms a feedback loop, analogues to the "flip-flop" in electrical circuit, to maintain the memory. A light source is used as a control signal for the memory. An "erase" instruction is carried out when the intensity of the light source falls below a defined threshold. The memory in the cell is erased and the existing data in the memory cell is lost. These additions allow the memory to be read, erased, and written. This memory configuration is analogous to electrical random access memory or RAM. This embodiment is referred to herein as "O-RAM". Since the contents of this memory structure are easily rewritten there is no need for a junction for permanent decoupling of the cell. The memory cell can used to store either single wavelength or multiple-wavelengths with appropriate controls.

The existence of a working design for a truly random access multi-wavelength optical memory removes a major obstacle preventing the availability of optical computers.

Figure 7:
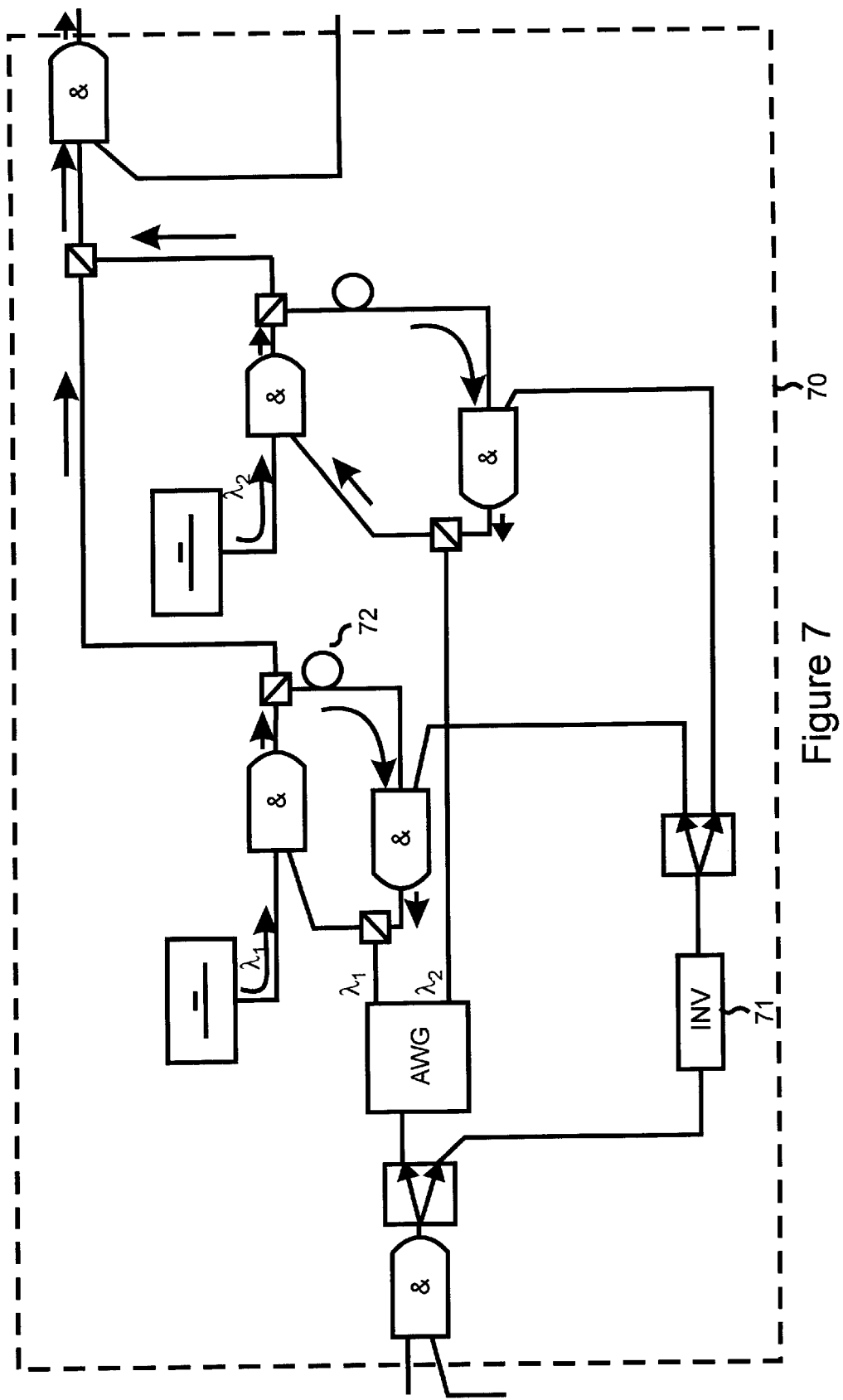
FIG. 7 is a block diagram of another optical memory configured as random access memory.

In a third embodiment another O-RAM cell design is demonstrated, see FIG. 7. This design is functionally very similar to the second embodiment however it automatically eliminates the contents of the memory when a new data signal is written. This is accomplished by splitting the data input line. One of the data input acts as described in the second embodiment, the second data input line goes through an inverter 71. The output of the inverter is connected to the waveguides used to accept the "erase" signal. Thus when new data is being written the previous data is automatically erased. A signal delayer 72 is used to ensure that the signals are correctly synchronized.

Figure 8:
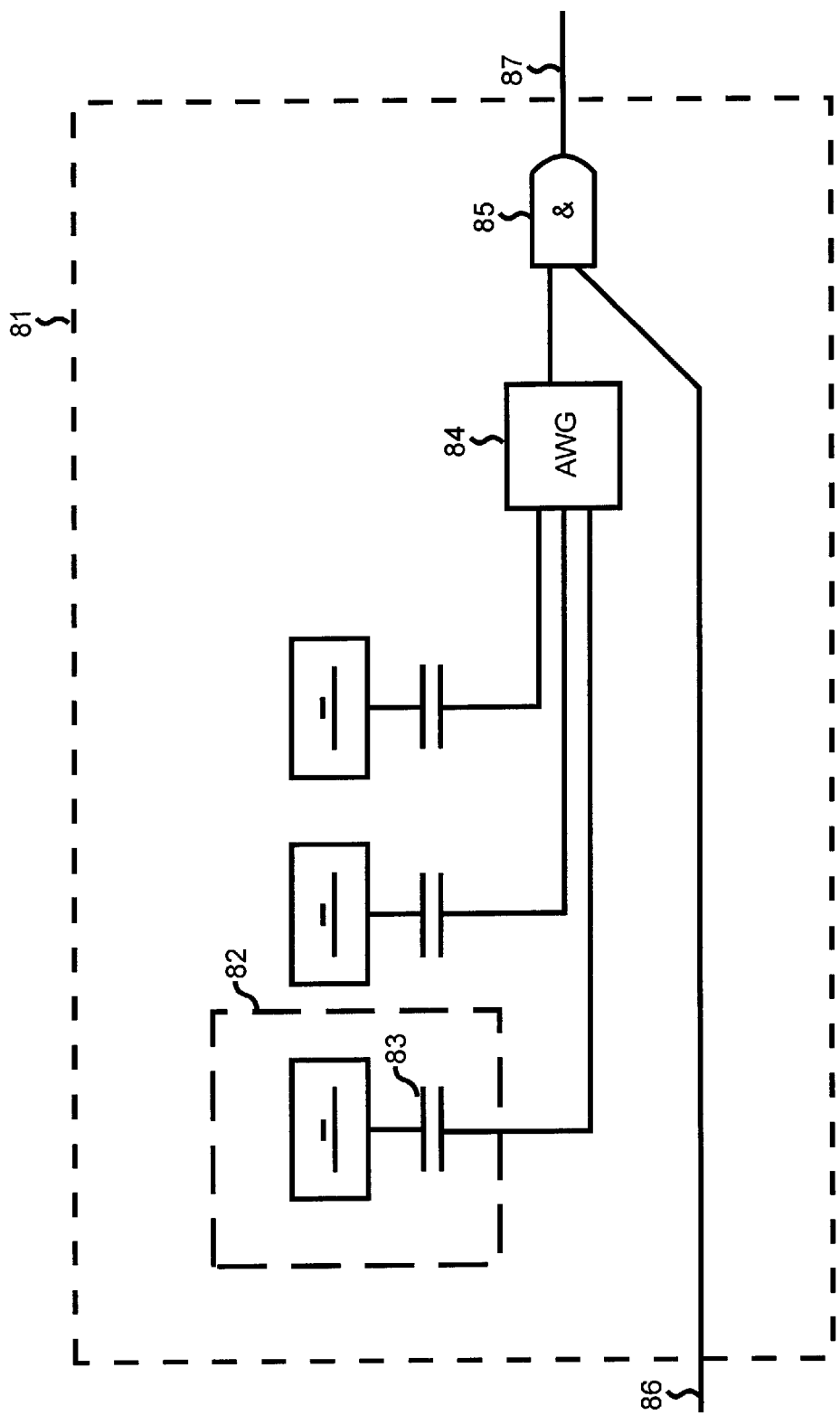
FIG. 8 is a block diagram of another optical memory configured as read only memory, and, FIG. 9 is a block diagram of a binary optical memory configured as a random access memory.

In a fourth embodiment, an O-ROM cell 81 is demonstrated, see FIG. 8. A set of laser sources 82 is present. Each laser having a different wavelength and each have a waveguide with a junction 83 that can be severed to prevent optical coupling with the remainder of the circuit. The output signals of the lasers, having passed their respective junctions are combined with an arrayed waveguide grating or AWG 84. This combined signal is used as the pump input for an O-AND gate 85. The O-AND gate is modulated by an external input signal presented at an input port 86. The output port of the O-AND gate 87 provides an output signal. When an external input signal of sufficient intensity is present, the output signal will be the sum of the pump signals whose junctions have not been severed.

In a fifth embodiment, an O-ROM cell 81 is demonstrated, see FIG. 8. A set of laser sources 82 is present.

Each laser having a different wavelength and each have a waveguide with a junction 83 that can be severed to prevent optical coupling with the remainder of the circuit. The output signals of the lasers, having passed their respective junctions are combined with an arrayed waveguide grating or AWG 84. This combined signal is used as the pump input for an O-AND gate 85. The O-AND gate is modulated by an external input signal presented at an input port 86. The output port of the O-AND gate 87 provides an output signal. When an external input signal of sufficient intensity is present, the output signal will be the sum of the pump signals whose junctions have not been severed.

In a fifth embodiment, a plurality of O-PROM and O-RAM cells share their continuous source lasers, thereby ensuring that the output signals are provided at very consistent wavelengths. Additionally, using a source laser for a set of ram cells reduces the total cost of the optical device since source lasers can be costly in large numbers.

In a sixth embodiment, a plurality of O-RAM cells are combined to make an addressable memory. The addressing of the individual cells is controlled by optical logic gates. The operation of these gates is based upon the wavelengths and intensity of a set of addresses signals. The address signals are chosen to have the same properties as the optical signals which the O-RAM is storing.

Figure 9:
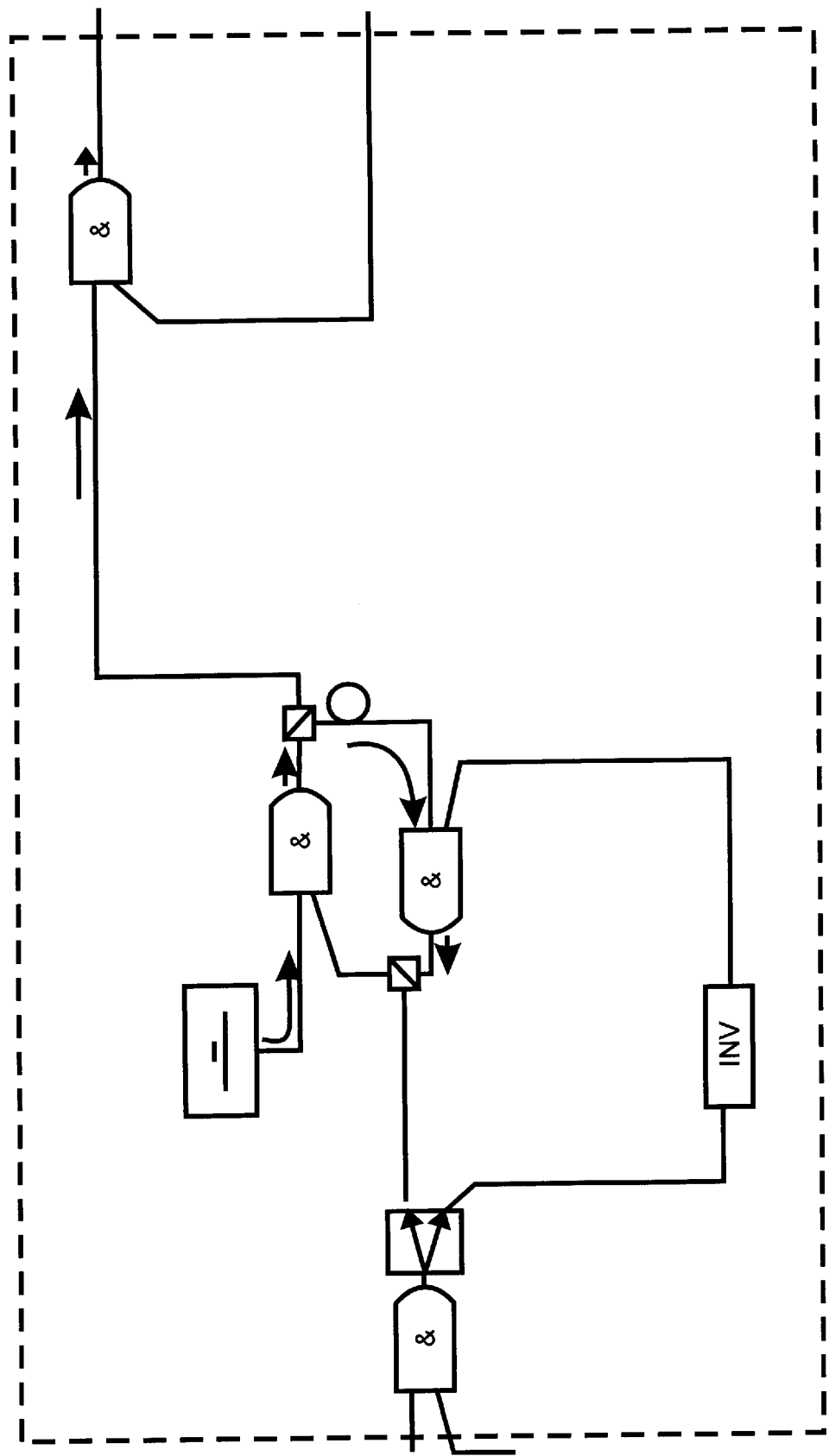

In a seventh embodiment, a simplified O-RAM cell is demonstrated, see FIG. 9. This version of O-RAM will only maintain a signal binary digit of information. This embodiment does not take full advantage of the technology however it does correspond closely to an electrical bit. Therefore it is advantageous in producing an optical binary computer. This cell is very similar to the O-RAM cell presented in the third embodiment however the wavelength dispersing element has been eliminated and the cell will output an optical signal with one predetermined wavelength based upon the presence of an input signal and a feedback signal. The output of the cell does not vary based on the wavelength of the input within reasonable limits associated with the SOAs.

Numerous other embodiments of the invention are possible without departing for the and scope of this document.

What is claimed is:

1. An optical memory device comprising:
   an input port for receiving a first optical signal including an intensity of light and a wavelength thereof;
   a dispersive element for dispersing the first optical signal received at the input port in dependence upon wavelength;
   a plurality of optical memory elements each comprising a first input port for receiving light dispersed by the dispersive element, a second input port for receiving light with a predetermined wavelength from a light source, an output port, an N-ary wavelength domain O-AND gate for receiving a second optical signal and for modulating light emitted by the continuous source in dependence upon the second optical signal; a feedback path for receiving light from the output port and for feeding back the received light; and a coupler for coupling the light within the feedback path and the light received at the first input port to the modulator as the second optical signal to the modulator,
   wherein the outputs of the plurality of optical memory elements are optically coupled to the output port of the memory cell for outputting the memorized optical signal of a light intensity and a wavelength.

2. An optical memory device according to claim 1, further comprising an O-AND gate for switching the first optical input signal in dependence upon a second external input signal.

3. An optical memory device according to claim 2, wherein the second external input signal is an optical signal.

4. An optical memory device according to claim 3, wherein a second optical input signal is for controlling the light received at the first input port on whither letting the first input signal to sent into the memory device.

5. An optical memory device according to claim 1, comprising another O-AND gate for controlling the output optical signal at the output port of a optical memory cell from the plurality of optical memory elements in dependence a third external input signal.

6. An optical memory device according to claim 5, wherein the third external input signal is an optical signal.

7. An optical memory device according to claim 1, wherein the coupler couples at least one of the light signals within the feedback path and the light received at the first input port to the O-AND gate as the second optical signal to the O-AND gate.

8. An optical memory device according to claim 7, wherein when the coupler couples the light within the feedback path, the light received at the first input port and the light within the feedback path are simultaneously coupled to the O-AND gate at least temporarily during a transition of the switch.

9. An optical memory device comprising:
   an input port for receiving an optical modulating signal;
   a plurality of continuous light sources for providing a light signal having a predetermined wavelength;
   a coupler for receiving light signals from some of the continuous light sources;
   a plurality of waveguide junctions each optically coupled between two inputs to one output; and
   a plurality of O-AND gates for on-or-off switching functions independence of the wavelength of the light.

10. An optical memory device comprising:
    an input port for receiving a first optical signal including an intensity of light and a wavelength therefore;
    one optical memory element comprising a first input port for receiving light a second input port for receiving light with a predetermined wavelength from a light source, an output port, an O-AND gate for receiving a second optical signal and for switching light emitted by the continuous source in dependence upon the second optical signal; a feedback path for receiving light from the output port and for feeding back the received light; and a coupler for coupling the light within feedback path and the light received at the first input port to the O-AND gate as the second optical signal to the O-AND gate, wherein the coupler couples at least one of the light signals within the feedback path and the light received at the first input port to the O-AND gate as the second optical signal to the O-AND gate.

* * * * *